United States Patent [19]

Kosemura et al.

[11] Patent Number: 4,578,343

[45] Date of Patent: Mar. 25, 1986

[54] METHOD FOR PRODUCING FIELD EFFECT TYPE SEMICONDUCTOR DEVICE

[75] Inventors: Kinjiro Kosemura, Atsugi; Yoshimi Yamashita, Sagamihara; Noriaki Nakayama, Ebina; Sumio Yamamoto, Yokohama, all of Japan

[73] Assignee: Fujitsu Limited, Kawasaki, Japan

[21] Appl. No.: 717,477

[22] Filed: Mar. 28, 1985

Related U.S. Application Data

[63] Continuation of Ser. No. 533,977, Sep. 20, 1983, abandoned.

[30] Foreign Application Priority Data

Sep. 21, 1982 [JP] Japan ................................ 57-163063

[51] Int. Cl.⁴ ................................................ G03C 5/00
[52] U.S. Cl. ................................ 430/296; 430/312; 430/314; 430/315; 430/317; 430/319; 430/394
[58] Field of Search ............... 430/296, 312, 313, 314, 430/315, 317, 319, 394, 503

[56] References Cited

U.S. PATENT DOCUMENTS 3,951,708  4/1976  Dean .
4,341,850  7/1982  Coane .
4,362,809  12/1982  Chen et al. ........................ 430/312

FOREIGN PATENT DOCUMENTS 53-76757  7/1978  Japan ........................ 430/312
56-23746  6/1981  Japan ........................ 430/312
57-103318 6/1982  Japan ........................ 430/296

OTHER PUBLICATIONS

Fukui et al., IEEE Trans Electron Devices, vol. ED-27, No. 6, Jun. 1980, pp. 1034–1037.
Ohata et al., IEEE Trans. Electron Devices, vol. ED-27, No. 6, Jun. 1980, pp. 1029–1034.
Patent Abstracts of Japan, vol. 2, No. 90, Jul. 22, 1978, pps. 4183E78.

*Primary Examiner*—John E. Kittle
*Assistant Examiner*—José G. Dees
*Attorney, Agent, or Firm*—Staas & Halsey

[57] ABSTRACT

A method for producing a field effect type semiconductor device includes the steps of forming a semiconductor active layer on a substrate, forming a resist layer on the semiconductor active layer, exposing a first portion of the resist layer in accordance with a gate electrode pattern, carrying out auxiliary exposure of a second portion near the first portion after or before the exposure of the first portion. The method further includes developing the exposed resist layer, forming a recess in the semiconductor active layer by etching the exposed semiconductor active layer using the resist layer as a mask and forming a gate electrode on the surface of the recess using the resist layer as a mask. This method improves the series resistance between the source electrode and the gate electrode, and also improves the Schottky withstand voltage between the drain electrode and the gate electrode.

9 Claims, 10 Drawing Figures

METHOD FOR PRODUCING FIELD EFFECT TYPE SEMICONDUCTOR DEVICE

This is a continuation of co-pending application Ser. No. 533,977 filed on Sept. 20, 1983, now abandoned.

BACKGROUND OF THE INVENTION (1) Field of the Invention

The present invention relates to a method for producing a field effect type semiconductor device, more particularly to a method for producing a Schottky barrier type field effect transistor (FET) using a semiconductor layer of gallium arsenide (GaAs) as an active layer.

(2) Description of the Prior Art

Schottky barrier type FET's using a semiconductor layer consisting of GaAs as an active layer (GaAs FET's) have been coming into increasing use due to their high frequency, high power, and high efficiency. Such high-performance GaAs FET's may, for example, be formed by a recess structure, in which the part of the GaAs active layer where a gate electrode is arranged is thinned, and an offset structure, in which a source electrode is arranged close to a gate electrode.

The advantage of this recess and offset structure is that the series resistance between the source electrode and the gate electrode can be decreased, the transconductance improved, and high frequency and high power obtained. Further, by keeping the length of the side of the drain electrode long, the Schottky withstand voltage between the gate electrode and the drain electrode can be increased, so that the gate current is decreased during the operation thereof, with the result that electromigration is also prevented.

In the recess structure, one shortens the recess width and forms the gate electrode on the center portion thereof in order to improve the above characteristics. If a gate electrode is formed in the recess structure, however, the closer the widths of the recess and gate electrode, the greater the difficulty of extending the depletion layer, whereby a high electric field is formed and the Schottky withstand voltage between the gate electrode and drain electrode is reduced. Further, when the Schottky withstand voltage is reduced, the operating gate current of the FET is increased, whereby electromigration of the gate electrode occurs and the life of the FET is remarkably shortened.

As a method for improving the Schottky withstand voltage, there has been provided a method for lowering carrier concentration in an active layer. However, when the carrier concentration in the active layer is lowered the transconductance is decreased and an FET having high performance characteristics cannot be obtained.

SUMMARY OF THE INVENTION

It is an object of the present invention to provide a method for producing an improved field effect type semiconductor device wherein the series resistance between a source electrode and a gate electrode is decreased and a Schottky withstand voltage between the gate electrode and a drain electrode is maintained.

According to the present invention, there is provided a method for producing a field effect type semiconductor device which includes the steps of forming a semiconductor active layer on a substrate, forming a resist layer on the semiconductor active layer, exposing a first portion of the resist layer in accordance with a gate electrode pattern, carrying out auxiliary exposure of a second portion near the first portion after or before the exposure of the first portion. The method also includes; developing the exposed resist layer, forming a recess in the semiconductor active layer by selectively etching the semiconductor active layer using the resist layer as a mask, and forming a gate electrode on the surface of the recess using the resist layer as a mask.

BRIEF DESCRIPTION OF THE DRAWINGS

The present invention will now be explained in more detail with reference to the accompanying drawings, in which.

DESCRIPTION OF THE PREFERRED EMBODIMENTS

FIGS. 1A to 1G are cross-sectional views of an embodiment of a production process according to the present invention.

Figure 1A:
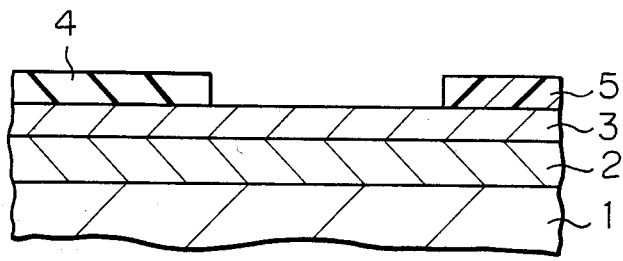
FIGS. 1A to 1G are cross-sectional views of an embodiment of a production process according to the present invention.

In FIG. 1A, a semiconductor substrate, for example, a semi-insulating GaAs substrate 1, is first prepared. An intrinsic GaAs layer 2 having a thickness of 3 to 5 $\mu$m is then formed on the substrate as a buffer layer by a well known chemical vapor deposition process. Then an N-type GaAs active layer 3 having a thickness of 0.5 to 0.5 $\mu$m is formed on the GaAs buffer layer 2, by a CVD process. The N-type GaAs layer 3 includes impurity ions, for example, sulfur ions of $1-3 \times 10^{17}$ atm/cm$^3$, and acts as a semiconductor active layer.

A source electrode 4 and a drain electrode 5 are formed on the N-type GaAs active layer 3 at a short distance from each other, for example, 4 to 5 $\mu$m, by a vapor deposition process and a selective etching process. The electrodes 4 and 5 are double layer types composed of an alloy layer consisting of an 88 wt % gold and a 12 wt % germanium and gold layer formed on the alloy layer. The total thickness of the double layer is 4000 to 5000 angstroms. The electrodes 4 and 5 are heat treated at a temperature of approximately 450° C. to create an ohmic contact between the electrodes 4 and 5 and the GaAs active layer 3.

Figure 1B:
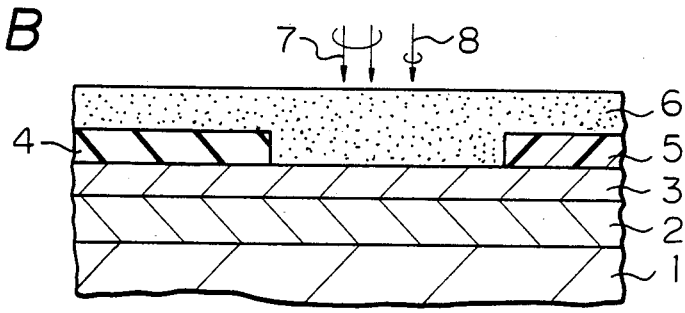

Referring to FIG. 1B, a resist layer 6, for example, a positive resist layer for electrode beam exposure such as Fujitsu CMR-100 resist, is next formed over the exposed surfaces of the source and drain electrodes 4 and 5 and the GaAs active layer 3 by means of a spinner (not shown). After forming the resist layer 6, a baking treatment is carried out at a temperature of approximately 190° C.

A first electron beam 7 is selectively irradiated to a first portion of the surface of the resist layer 6, i.e., the portion closer to the source electrode 4 than the drain electrode 5, to expose a gate electrode pattern. The first electron beam irradiation is preferably carried out under an accelerated voltage of 20 KV, a beam current of 1 to 10 nA, for example, 2.5 nA, a frequency of 14 to 130 kHz, for example, 35.35 kHz, a beam dosage of 4 to $10 \times 10^{-4}$ c/cm$^2$, for example, $4.53 \times 10^{-4}$ c/cm$^2$, and 1 to 5 passes, for example, one pass.

After the first electron beam irradiation, a second electron beam 8 is irradiated onto a second portion of the resist layer near the first portion, for example, 0.75 μm from the center of the first portion, the second portion being nearer to the drain electrode 5 than to the source electrode 4. The second electron beam irradiation is preferably carried out under the same accelerated voltage and beam current as the first electron beam irradiation, a frequency of 53 to 160 kHz, for example, 77.00 kHz, a beam dosage of 1 to $3 \times 10^{-4}$ c/cm$^2$, for example, $2.08 \times 10^{-4}$ c/cm$^2$, and 1 to 5 passes, for example, one pass.

Figure 1C:
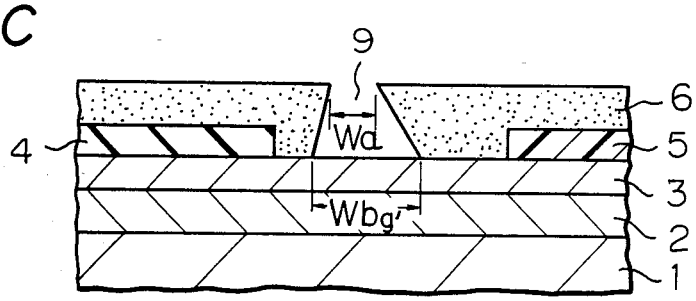

Referring now to FIG. 1C, the resist layer 6 is then developed by methylisobutyl ketone, etc. A hollow 9 having an upper opening having a width Wa and a bottom opening having a width Wb$_g$, is therefore formed in the resist in accordance with the pattern exposed by the first and the second electron beams 7 and 8. The hollow in the resist layer 6 is gradually larger and closer to the GaAs active layer 3 and has an asymmetric cross-section, i.e., the side near the drain electrode 5 is larger than that near the source electrode 4.

Figure 1D:
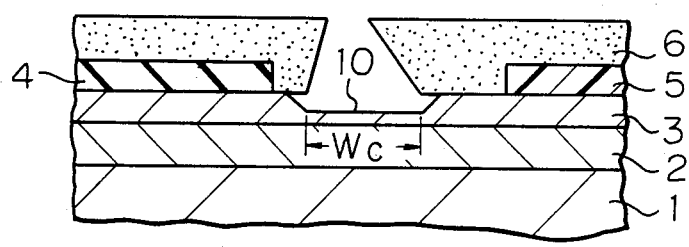

Referring to FIG. 1D, the GaAs active layer 3 is selectively etched by a wet etching process using an etchant of hydrofluoric acid and using the resist 6 as a mask to form a recess 10. The width and the depth of the recess 10 are determined by calculating the electric properties of the related FET. The bottom width Wc of the recess 10 equals the bottom width Wbg' (FIG. 1C) of the hollow. According to the present invention, the width of the upper opening Wa, the bottom width Wbg' of the hollow in the resist layer 6, and the bottom width Wc of the recess 10 can be controlled by controlling the first exposure and second exposure.

Figure 1E:
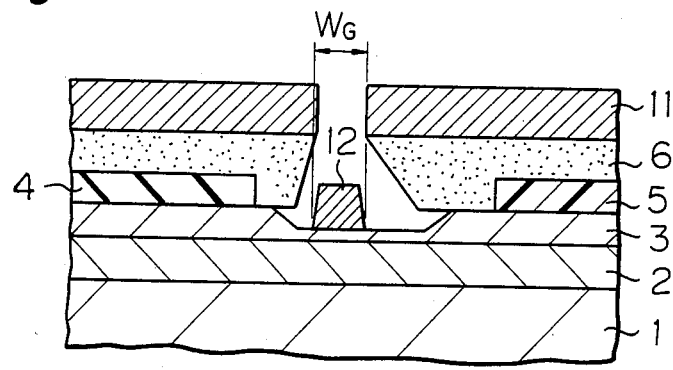

Then, as shown in FIG. 1E, a gate metal, for example, aluminum, is vapor-deposited using the resist layer 6 as a mask to form gate metal layers 11 and 12, having a thickness of about 0.7 μm, on the resist layer 6 and the recess 10. Since the hollow of the resist layer 6 is larger and closer to the GaAs active layer 3, the gate metal layers 11 and 12 are easily formed completely separate from each other. The width of the gate metal layer 12, i.e., gate width W$_G$, is substantially equal to the width Wa (FIG. 1C) of the hollow.

Figure 1F:
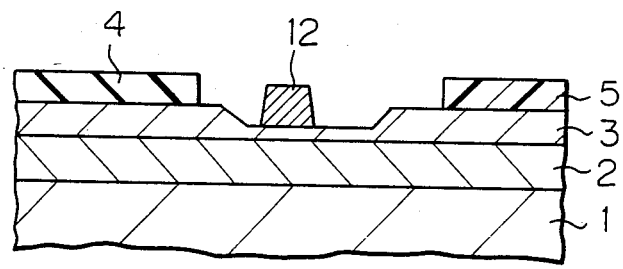

Then, as shown in FIG. 1F the resist layer 6 is removed by, for example, chemicals, lifting off the gate metal layer 11. This leaves the gate metal layer 12 as the gate electrode. For example, the gate electrode can be placed at a position shifted from the mid line of the source and drain electrodes by 0.5 μm toward the source electrode.

Figure 1G:
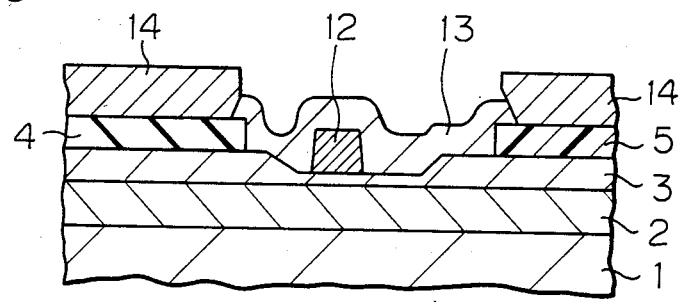

Referring to FIG. 1G, the exposed surfaces of the gate metal layer 12, the source electrode 4, the drain electrode 5, and the GaAs active layer 3 are covered with an insulating layer 13, for example, a silicon dioxide layer, which acts as a passivation layer and has a thickness of, for example, 5000 to 6000 angstroms. The insulating layer 13 is formed by a well known chemical vapor deposition process or a sputtering process. The part of the insulating layer 13 on the source electrode 4 and the drain electrode 5 is selectively removed, and a plated gold layer 14 having a thickness of 0.5 to 2 μm is formed on the source and drain electrodes 4 and 5 by using the insulating layer 13.

Thus, the GaAs FET according to the present invention can be produced.

When a gate electrode is formed on a recess, in the conventional method, the resist layer is developed by electron beam irradiation only at one portion. Thus, the hollow in the resist layer becomes gradually larger closer to the GaAs active layer and has a symmetric cross-section. However, in the present invention, the resist layer is developd by electron beam irradiation at two portions, i.e., the first and the second exposure, as explained above. Thus, the hollow in the resist becomes gradually larger closer to the GaAs active layer and has an asymmetric cross-section, i.e., the nearer the drain electrode, the larger the cross-sectional area of the hollow.

Figure 2:
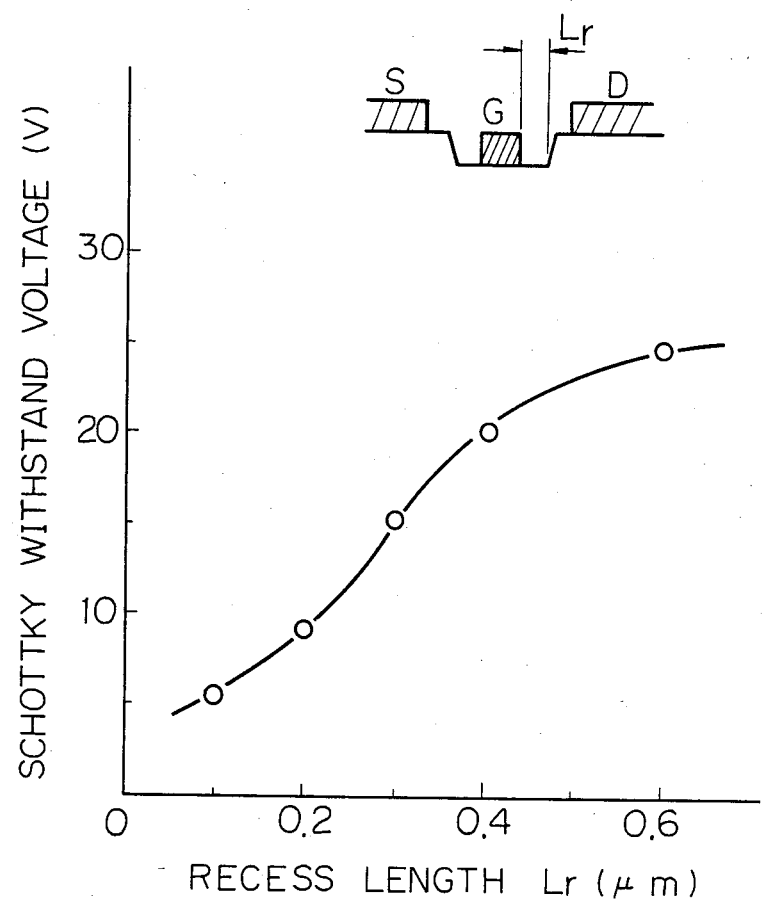
FIG. 2 is a graph of the relationship between the recess length and the Schottky withstand voltage.

Therefore, in the present invention, the gate electrode can be formed much closer to the source electrode side than to the drain electrode side, with the result that the series resistance between the source electrode and the gate electrode can be decreased. Furthermore, as shown in FIG. 2, the Schottky withstand voltage is improved when the recess length Lr is increased. The conventional recess length Lr is at most 0.2 μm, thus the Schottky withstand voltage is 8V, as shown in FIG. 2. However according to the present invention the recess length Lr can be 0.6 μm. Thus the Schottky withstand voltage is improved, so that the value of the voltage becomes 25V, with the result that the gate current is decreased during the operation thereof and electromigration is also prevented. Further, according to the present invention, a high power and high efficiency MES FET can be obtained.

In this invention the second exposure of the resist layer may be carried out before the first exposure. The second exposure of the resist layer may be carried out in such a manner that some of the resist layer is doubled by the first exposure of the resist layer.

Figure 3:
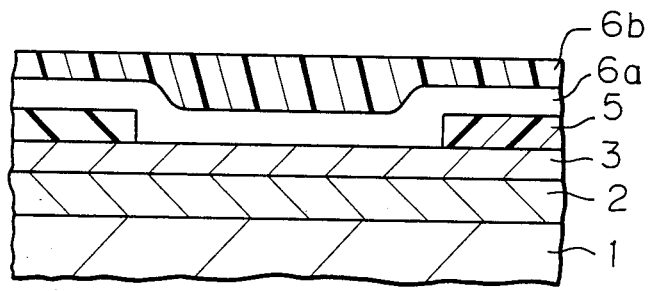
FIGS. 3 and 4 are cross-sectional views of processes for forming a resist layer on a semiconductor active layer according to the present invention.
Figure 4:
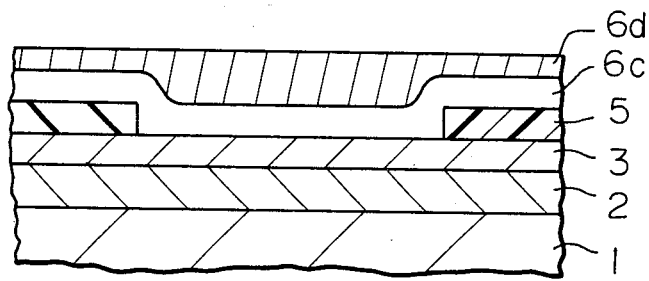

It is preferable to use a combination of resist layers. For example, as in FIG. 3, there may be provided a resist layer 6a which has a high sensitivity, for example, Fujitsu CMR-100 resist, and a resist layer 6b which has a sensitivity lower than the resist layer 6a for example, Tokyo Ohka OEBR-1000 resist, the resist layer 6b being provided on the resist 6a. Alternatively, as in FIG. 4, there may be provided a resist layer 6c which is pre-exposed on the entire surface thereof and a resist layer 6d. The resist layers 6c and 6d being, for example, Fujitsu CMR-100 resist. By using the above two types of resist layers, the asymmetrical hollow in the resist can be easily formed.

The present invention can be applied to a Metal Schottky (MES) GaAs or InP FET, MIS GaAs or InP FET, or Heterojunction FET such as a High Electron Mobility Transistor (HEMT) proposed by the assignee of this application.

We claim:

1. A method for producing a field effect type semiconductor device comprising the steps of:
   (a) forming a semiconductor active layer on a substrate;
   (b) forming source and drain electrodes on the semiconductor active layer;
   (c) forming a resist layer on the semiconductor active layer and the source and drain electrodes;
   (d) exposing a first portion of the resist layer in accordance with a gate electrode pattern;
   (e) carrying out auxiliary exposure of a second portion of the resist layer adjacent the first portion after or before the exposure of the first portion of the resist layer in said step (d);
   (f) developing the exposed resist layer to form an upper opening of the resist layer in accordance with the gate electrode pattern and a lower opening of the resist layer in accordance with the exposure of the first and second portions, the cross-section of the opening of the resist layer in the source-drain direction being asymmetrically enlarged by the developing process in the area near the drain electrode;

(g) forming a recess in the semiconductor active layer by etching the exposed semiconductor active layer through the lower opening of the resist layer using the resist layer as a mask, the recess having an asymmetric structure and being enlarged, with respect to the upper opening, in the area near the drain electrode; and (h) forming a gate electrode on the surface of the recess using the resist layer as a mask, the position of the gate electrode being closer to the source electrode than to the drain electrode and being aligned with the edges of the upper opening.

2. A method according to claim 1, wherein said step (c) comprises forming the resist layer of a double layer including a first sensitive resist layer and a second sensitive resist layer which is less sensitive than the first sensitive resist layer and which is formed on the first sensitive resist layer.

3. A method according to claim 1, wherein said step (c) comprises forming the resist layer of a double layer including a first resist layer and a second resist layer provided on the first resist layer, the first resist layer being pre-exposed.

4. A method according to claim 1, wherein said steps (a) and (e) of exposing the resist layer each comprise the substep of irradiating the resist layer with an electron beam.

5. A method according to claim 4, wherein said step (d) comprises exposing the resist layer at an exposure frequency of 14 to 130 kHz.

6. A method according to claim 4, wherein said step (e) comprises exposing the resist layer at an exposure frequency of 53 to 160 kHz.

7. A method according to claim 4, wherein said step (d) comprises exposing the resist layer with an electron beam dosage of 4 to $10 \times 10^{-4}$ c/cm$^2$.

8. A method according to claim 4, wherein said step (e) comprises exposing the resist layer with an electron beam dosage of 1 to $3 \times 10^{-4}$ c/cm$^2$.

9. A method according to claim 1, wherein the recess has first and second sides and wherein said step (h) comprises the substep of forming the gate electrode closer to the first side of the recess layer.

* * * * *

UNITED STATES PATENT AND TRADEMARK OFFICE
CERTIFICATE OF CORRECTION

PATENT NO. : 4,578,343
DATED : MARCH 25, 1986
INVENTOR(S) : KINJIRO KOSEMURA ET AL.

It is certified that error appears in the above-identified patent and that said Letters Patent is hereby corrected as shown below:

```
FRONT PAGE [57] ABSTRACT,
          line 6, after "," insert --and--.

Col. 2, line 1, after "," insert --and--;
        line 3, delete ";";
        line 34, [line numbering off], "0.5 to" should be
              --0.3 to--.

Col. 4, line 38, after "6a" insert --,--.

Col. 6, line 7, "(a)" should be --(d)--.
```

Signed and Sealed this

Fifteenth Day of July 1986

[SEAL]

Attest:

DONALD J. QUIGG

Attesting Officer

Commissioner of Patents and Trademarks